US012422495B2

(12) United States Patent
Tanaka et al.

(10) Patent No.: US 12,422,495 B2
(45) Date of Patent: Sep. 23, 2025

(54) METHOD FOR INSPECTING ENERGY STORAGE DEVICE, NON-TRANSITORY STORAGE MEDIUM, AND COMPUTER DEVICE (71) Applicant: TOYOTA JIDOSHA KABUSHIKI KAISHA, Aichi-ken (JP)

(72) Inventors: Nobuyuki Tanaka, Toyota (JP); Yoshihiro Uchida, Nagakute (JP); Kenta Onishi, Kariya (JP); Yuki Sugo, Toyota (JP); Kenta Fujimoto, Toyota (JP); Atsushi Kato, Okazaki (JP); Hiroshi Yoshida, Anjo (JP); Ryota Takizawa, Toyota (JP)

(73) Assignee: TOYOTA JIDOSHA KABUSHIKI KAISHA, Aichi-Ken (JP)

( * ) Notice: Subject to any disclaimer, the term of this patent is extended or adjusted under 35 U.S.C. 154(b) by 211 days.

(21) Appl. No.: 18/346,254

(22) Filed: Jul. 2, 2023

(65) Prior Publication Data
US 2024/0003984 A1  Jan. 4, 2024

(30) Foreign Application Priority Data

Jul. 4, 2022 (JP) ................... 2022-107751

(51) Int. Cl.
*G01R 31/392* (2019.01)
*G01R 31/382* (2019.01)
*H01M 10/44* (2006.01)
*H02J 7/00* (2006.01)
*B60L 53/62* (2019.01)

(52) U.S. Cl.
CPC ......... *G01R 31/392* (2019.01); *G01R 31/382* (2019.01); *H01M 10/44* (2013.01); *H02J 7/0049* (2020.01); *B60L 53/62* (2019.02); *B60L 2240/545* (2013.01)

(58) Field of Classification Search
None
See application file for complete search history.

(56) References Cited

U.S. PATENT DOCUMENTS

2012/0029851 A1\* 2/2012 Nakayama ......... G01R 31/3842
702/63

FOREIGN PATENT DOCUMENTS

| JP | 2014185896 A | 10/2014 |
| JP | 2017-143026 A | 8/2017 |
| WO | 2014147475 A2 | 9/2014 |

\* cited by examiner

Primary Examiner — Jas A Sanghera
(74) Attorney, Agent, or Firm — HAUPTMAN HAM, LLP (57) ABSTRACT A method for inspecting an energy storage device, the method includes: estimating a degree of degradation of the energy storage device; determining, based on the estimated degree of degradation, a measurement condition such that time required to measure a full charge capacity of the energy storage device decreases or increases; and measuring the full charge capacity according to the determined measurement condition.

11 Claims, 5 Drawing Sheets

METHOD FOR INSPECTING ENERGY STORAGE DEVICE, NON-TRANSITORY STORAGE MEDIUM, AND COMPUTER DEVICE

CROSS-REFERENCE TO RELATED APPLICATION

This application claims priority to Japanese Patent Application No. 2022-107751 filed on Jul. 4, 2022, incorporated herein by reference in its entirety.

BACKGROUND

1. Technical Field

The present disclosure relates to methods for inspecting an energy storage device, non-transitory storage media, and computer devices.

2. Description of Related Art

For example, Japanese Unexamined Patent Application Publication No. 2014-185896 (JP 2014-185896 A) discloses a technique of accurately measuring the full charge capacity of an energy storage device based on the state of charge (SOC) of the energy storage device.

SUMMARY

It is desirable to regularly inspect an energy storage device that is used on a daily basis. Such an inspection checks whether there is no problem with continuing to use the energy storage device. The energy storage device is replaced when, for example, its full charge capacity falls below a reference value.

However, accurately measuring the full charge capacity of the energy storage device by, for example, the method described in JP 2014-185896 A would increase the time it takes to inspect the energy storage device. Since the user cannot use the energy storage device during the inspection, regular inspections may excessively reduce user convenience if they take time.

It is an object of the present disclosure to provide a method for inspecting an energy storage device, non-transitory storage medium, and computer device that can adjust the time it takes to inspect an energy storage device according to the state of the energy storage device.

A method for inspecting an energy storage device according to a first aspect of the present disclosure will be described below.

(1)

A method for inspecting an energy storage device includes: estimating a degree of degradation of the energy storage device; determining, based on the estimated degree of degradation, a measurement condition such that time required to measure a full charge capacity of the energy storage device decreases or increases; and measuring the full charge capacity according to the determined measurement condition.

According to the above method, the measurement condition (that is, the condition for measuring the full charge capacity of the energy storage device) changes according to the estimated degree of degradation of the energy storage device. When the degree of degradation of the energy storage device is sufficiently low, it is clear that the energy storage device is normal (that is, there is no problem with continuing to use the energy storage device). Therefore, there is little need to spend long time to measure the full charge capacity. On the other hand, when the degree of degradation of the energy storage device is high, there is a possibility that the full charge capacity of the energy storage device has decreased too much. It is therefore desirable to accurately measure the full charge capacity of the energy storage device even if it takes time. In this regard, according to the above method, the measurement condition is determined so that the time required to measure the full charge capacity can be reduced or increased according to the estimated degree of degradation of the energy storage device. Therefore, when the degree of degradation of the energy storage device is sufficiently low, the full charge capacity is measured in a short time. When the degree of degradation of the energy storage device is high, the measurement time is increased so that the full charge capacity can be accurately measured. It is also possible to increase the measurement time when the degree of degradation of the energy storage device is around the degree of degradation for which it is desired to accurately measure the full charge capacity. For example, it is herein assumed that it is desired to accurately measure the full charge capacity for the degree of degradation of around 70%. In this case, when the degree of degradation of the energy storage device is around 70%, the measurement time may be increased to accurately measure the full charge capacity of the energy storage device. When the degree of degradation of the energy storage device is not around 70%, the measurement accuracy may be reduced to reduce the measurement time. As described above, according to the above method, it is possible to adjust the time it takes to inspect the energy storage device according to the state of the energy storage device.

The method according to (1) may have a configuration according to any one of (2) to (10) that will be described below.

(2)

In the above aspect, determining the measurement condition may include determining the measurement condition such that the time required to measure the full charge capacity decreases.

(3)

In the above aspect, the method for inspecting an energy storage device may further include: determining whether the determined measurement condition meets a predetermined requirement; and when determination is made that the measurement condition meets the predetermined requirement, performing the measurement of the full charge capacity, and determining, based on the measured full charge capacity, whether the energy storage device needs to be replaced, wherein determining, according to the estimated degree of degradation, the measurement condition includes determining the measurement condition such that the measurement condition meets the predetermined requirement.

The full charge capacity for determining whether the energy storage device needs to be replaced is desirably measured according to a condition that meets a predetermined requirement (e.g., a requirement determined by laws and regulations or standards). According to the above method, the full charge capacity is measured according to the condition determined according to the estimated degree of degradation, and whether the energy storage device needs to be replaced is determined based on the measured full charge capacity. This makes it easier to accurately determine whether the energy storage device needs to be replaced.

(4)

In the above aspect, the method may further include: determining, according to the estimated degree of degradation, the measurement condition includes determining the measurement condition such that the measurement condition meets the predetermined requirement; and the measurement of the full charge capacity is performed when determination is made that the measurement condition meets the predetermined requirement, but is not performed when determination is made that the measurement condition does not meet the predetermined requirement.

According to the above method, the full charge capacity is measured according to the condition determined according to the estimated degree of degradation. The full charge capacity can thus be accurately measured. When the measurement condition does not meet the predetermined requirement, the estimation of the degree of degradation of the energy storage device is performed, but the measurement of the full charge capacity according to the above measurement condition is not performed. This reduces the time it takes to inspect the energy storage device, so that user convenience is less likely to be reduced by the inspection.

(5)

In the above aspect, measuring the full charge capacity of the energy storage device may include: discharging the energy storage device; waiting until first wait time elapses without charging and discharging the energy storage device after the discharge ends; charging the energy storage device after elapse of the first wait time; waiting until second wait time elapses without charging and discharging the energy storage device after the charge ends; and obtaining the full charge capacity of the energy storage device after elapse of the second wait time. Determining the measurement condition may include determining at least one of the following based on the estimated degree of degradation: a condition for ending the discharge, the first wait time, a condition for ending the charge, and the second wait time.

According to the above method, it becomes easier to suitably measure the full charge capacity of the energy storage device. Since the first and second wait times are provided, polarization in the energy storage device is more likely to be reduced.

(6)

In the above aspect, discharging the energy storage device may include ending the discharge when a state of charge (SOC) of the energy storage device becomes equal to or less than a first SOC value during the discharge of the energy storage device. Charging the energy storage device may include ending the charge when the SOC of the energy storage device becomes equal to or higher than a second SOC value during the charge of the energy storage device. Obtaining the full charge capacity of the energy storage device may include calculating the full charge capacity of the energy storage device using a voltage value of the energy storage device after the elapse of the first wait time and a voltage value of the energy storage device after the elapse of the second wait time.

According to the above method, it becomes easier to suitably measure the full charge capacity of the energy storage device. The conditions for ending the charge and the discharge can be appropriately set based on the first and second SOC values. Since the full charge capacity of the energy storage device is calculated using the voltage values of the energy storage device after polarization is reduced, it becomes easier to accurately obtain the full charge capacity of the energy storage device.

(7)

In the above aspect, the first state-of-charge value may be set to a lower value as the estimated degree of degradation is higher, and the second state-of-charge value may be set to a higher value as the estimated degree of degradation is higher.

The lower the first SOC value, the longer it takes to discharge the energy storage device. The higher the second SOC value, the longer it takes to charge the energy storage device. The larger the SOC range from the first SOC value to the second SOC value, the higher the measurement accuracy of the full charge capacity tends to be. Therefore, according to the above configuration, it becomes easier to determine the measurement condition so that the measurement time increases and the measurement accuracy increases as the estimated degree of degradation of the energy storage device increases.

(8)

In the above aspect, the first wait time may be set to a longer time as the estimated degree of degradation is higher, and the second wait time may be set to a longer time as the estimated degree of degradation is higher.

The longer the first and second wait times, the higher the measurement accuracy of the full charge capacity tends to be. Therefore, according to the above configuration, it becomes easier to determine the measurement condition so that the measurement time increases and the measurement accuracy increases as the estimated degree of degradation of the energy storage device increases.

(9)

In the above aspect, the first wait time may be set to a longer time as a temperature of the energy storage device is lower, and the second wait time may be set to a longer time as the temperature of the energy storage device is lower.

The lower the temperature of the energy storage device, the less likely polarization in the energy storage device is to be reduced. By increasing the wait time as the temperature of the energy storage device decreases as described above, polarization in the energy storage device is more likely to be sufficiently reduced.

The energy storage device may be an energy storage device used in a vehicle. Estimating the degree of degradation may include estimating the degree of degradation using usage history data of the vehicle.

By using the usage history data of the vehicle as described above, the degree of degradation of the energy storage device used in the vehicle can be estimated in a short time.

The usage history data of the vehicle may include data indicating an odometer reading of the vehicle. Estimating the degree of degradation may include estimating that the degree of degradation increases as the odometer reading increases.

The higher the odometer reading of the vehicle, the higher the degree of degradation of the energy storage device used in the vehicle tends to be. By using the odometer reading of the vehicle as described above, the degree of degradation of the energy storage device used in the vehicle can be easily and accurately estimated.

(10)

In the above aspect, estimating the degree of degradation of the energy storage device may include estimating the degree of degradation of the energy storage device using a map that defines a relationship between the usage history data of the vehicle and the degree of degradation.

A non-transitory storage medium according to a second aspect of the present disclosure stores instructions that are executable by one or more processors and that cause the one or more processors to perform functions. The functions include performing the method according to any one of (1) to (10).

A computer device according to a third aspect of the present disclosure includes the above non-transitory storage medium.

According to the present disclosure, it is possible to adjust the time it takes to inspect an energy storage device according to the state of the energy storage device.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

An embodiment of the present disclosure will be described in detail with reference to the drawings. The same or corresponding parts are denoted by the same signs throughout the drawings, and description thereof will not be repeated.

Figure 1:
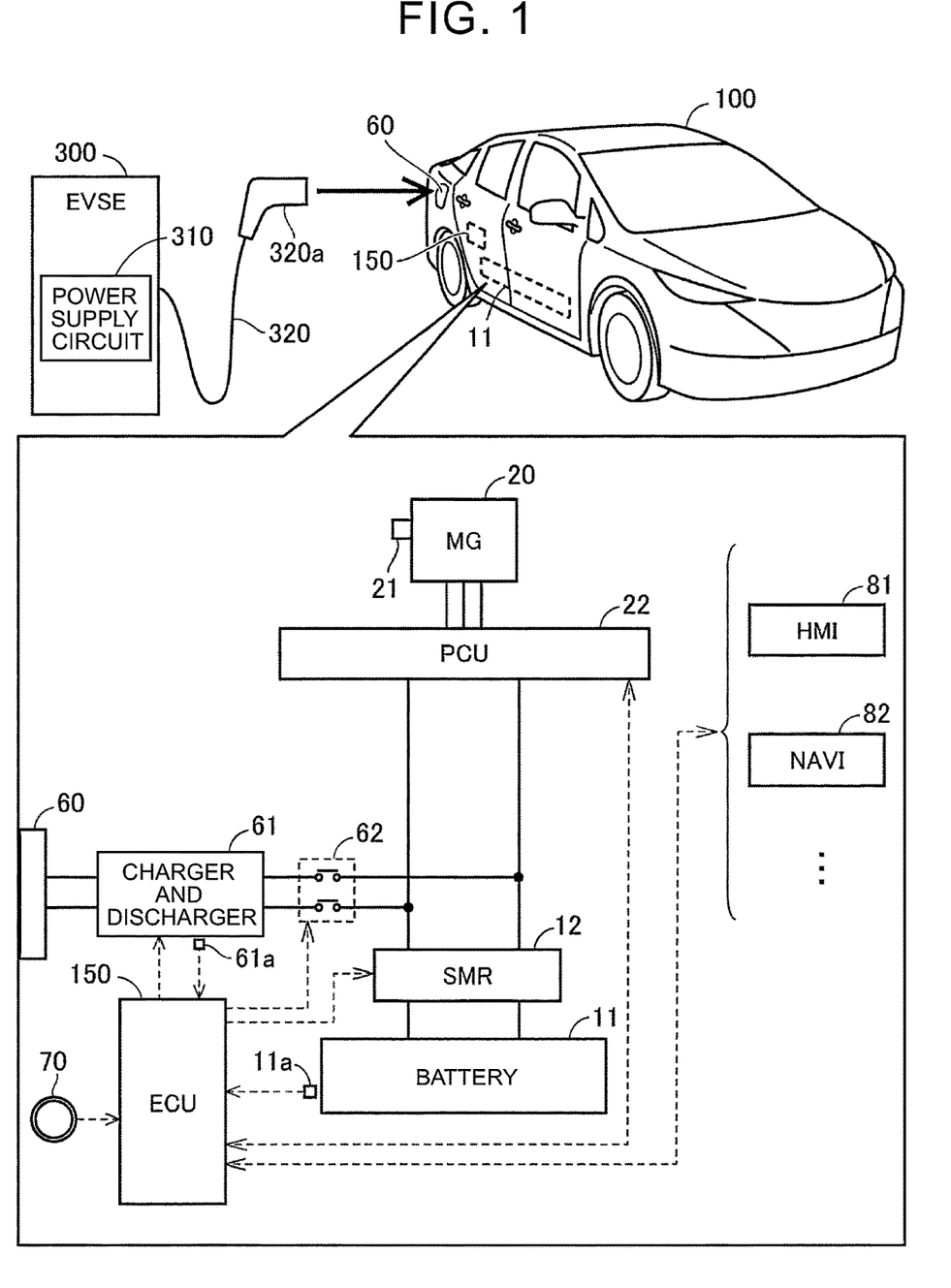
FIG. 1 shows a configuration of a vehicle according to an embodiment of the present disclosure.

FIG. 1 shows a configuration of a vehicle according to the present embodiment. Referring to FIG. 1, a vehicle 100 according to the present embodiment includes a battery 11 that is chargeable with electric vehicle supply equipment (EVSE) 300. The vehicle 100 is configured to run on the power stored in the battery 11. The vehicle 100 according to the present embodiment is a battery electric vehicle (BEV) without an engine (internal combustion engine). However, the present disclosure is not limited to this, and the vehicle 100 may be a plug-in hybrid electric vehicle (PHEV). The battery 11 can be a known energy storage device for vehicles (e.g., a liquid secondary battery, an all-solid-state secondary battery, or a battery pack). Examples of the secondary batteries for vehicles include a lithium-ion battery and a nickel metal hydride battery. The battery 11 is an example of the "energy storage device" according to the present disclosure.

The vehicle 100 further includes an inlet 60. A connector 320a of the EVSE 300 can be connected to and disconnected from the inlet 60. The Inlet 60 is a charge and discharge port that serves as both a charge port and a discharge port. The vehicle 100 is electrically connected to the EVSE 300 when the connector 320a of a charging cable 320 connected to the body of the EVSE 300 is connected to the inlet 60 of the vehicle 100 in a parked state (hereinafter also referred to as "plugged-in state"). On the other hand, the vehicle 100 is not electrically connected to the EVSE 300 when, for example, the vehicle 100 is moving (hereinafter also referred to as "unplugged state"). Although FIG. 1 shows only the inlet 60 compatible with the type of power supply of the EVSE 300, the vehicle 100 may have a plurality of inlets so that the vehicle 100 is compatible with a plurality of types of power supply (e.g., alternating current (AC) and direct current (DC)).

The EVSE 300 is configured to supply power from an external power source (e.g., a power grid, not shown). The EVSE 300 includes a built-in power supply circuit 310 and the charging cable 320. The power supply circuit 310 is electrically connected to the external power source. The power supply circuit 310 converts the power from the external power source to power suitable for supply to the vehicle 100, and outputs the converted power to the charging cable 320. The charging cable 320 has the connector 320a (plug) at its distal end. The EVSE 300 outputs from the connector 320a the power to be supplied to the vehicle 100.

The vehicle 100 further includes a battery management system (BMS) 11a, a system main relay (SMR) 12, a motor generator (MG) 20, a power control unit (PCU) 22, and an electronic control unit (ECU) 150.

The BMS 11a monitors the state of the battery 11. Specifically, the BMS 11a includes various sensors that detect the state of the battery 11 (e.g., voltage, current, and temperature). The BMS 11a outputs the detection results of the sensors to the ECU 150. The ECU 150 can acquire the state of the battery 11 (e.g., temperature, current, voltage, and state of charge (SOC)) based on the output of the BMS 11a. The SOC indicates the remaining capacity. For example, the SOC is the ratio of the available capacity to the capacity when fully charged, and varies between 0% and 100%.

The vehicle 100 further includes a charger and discharger 61 and a charge and discharge relay 62. The charger and discharger 61 and the charge and discharge relay 62 are located between the inlet 60 and the battery 11. The charger and discharger 61 and the charge and discharge relay 62 are controlled by the ECU 150. In the present embodiment, a charge and discharge line including the inlet 60, the charger and discharger 61, and the charge and discharge relay 62 is connected between the SMR 12 and the PCU 22. However, the present disclosure is not limited to this, and the charge and discharge line may be connected between the battery 11 and the SMR 12.

In the present embodiment, the charger and discharger 61 serves as both a charge circuit and a discharge circuit. The charger and discharger 61 charges the battery 11 with the power input from outside the vehicle 100 to the inlet 60. The charger and discharger 61 discharges the power of the battery 11 to outside the vehicle 100 through the inlet 60. The charger and discharger 61 includes a power converter circuit. The power converter circuit includes, for example, a bidirectional inverter. The power converter circuit may convert power between direct current (DC) and alternating current (AC) in both directions. The charge and discharge relay 62 opens and closes a power path from the inlet 60 to the battery 11. The vehicle 100 further includes a monitoring module 61a that monitors the state of the charger and discharger 61. The monitoring module 61a includes various sensors that detect the state of the charger and discharger 61 (e.g., current sensor and voltage sensor). The monitoring module 61a outputs the detection results of the sensors to the ECU 150.

The vehicle 100 in the plugged-in state can perform external charging (that is, charging of the battery 11 with power supplied from outside the vehicle) and external power supply (that is, supply of power of the battery 11 to outside the vehicle). The power for the external charging is supplied from, for example, the EVSE 300 to the inlet 60. The charger and discharger 61 converts the power received by the inlet 60 (e.g., AC power) to power suitable for charging the battery 11 (e.g., DC power) and outputs the converted power to the battery 11. The power for the external power supply is supplied from the battery 11 to the charger and discharger 61. The charger and discharger 61 converts the DC power supplied from the battery 11 to power suitable for the external power supply (e.g., AC power) and outputs the converted power to the inlet 60. The charge and discharge relay 62 is closed (connected) when either the external charging or the external power supply is performed. The charge and discharge relay 62 is opened (disconnected) when neither the external charging nor the external power supply is performed.

For example, the MG 20 is a three-phase AC motor generator. The MG 20 serves as a traction motor for the vehicle 100. The MG 20 is driven by the PCU 22 to rotate drive wheels of the vehicle 100. The MG 20 also regeneratively generates power and supplies the generated power to the battery 11. The vehicle 100 further includes a motor sensor 21 that monitors the state of the MG 20. The motor sensor 21 includes various sensors that detect the state of the MG 20 (e.g., current sensor, voltage sensor, and temperature sensor). The motor sensor 21 outputs the detection results of the sensors to the ECU 150. The vehicle 100 may include any number of traction motors. The number of traction motors may be one, two, or three or more. The traction motor may be an in-wheel motor.

The PCU 22 drives the MG 20 with the power supplied from the battery 11. The SMR 12 opens and closes a power path from the battery 11 to the PCU 22. The PCU 22 includes, for example, an inverter and a DC-to-DC converter. The SMR 12 and the PCU 22 are controlled by the ECU 150. The SMR 12 is closed (connected) when the vehicle 100 is moving. The SMR 12 is also closed when power is transferred between the battery 11 and the inlet 60 (and outside the vehicle).

The vehicle 100 further includes a Human-Machine Interface (HMI) 81 and a navigation system (NAVI) 82. The HMI 81 includes an input device and a display device. The HMI 81 may include a touch panel display. The HMI 81 may include an instrument panel and/or a head-up display. The NAVI 82 detects the location of the vehicle 100 using, for example, a Global Positioning System (GPS), and displays the location of the vehicle 100 on a map in real time. The NAVI 82 also refers to map information and performs a route search.

A vehicle system including the ECU 150 (system that controls the vehicle 100) is turned on (started) and off (stopped) by the user operating a start switch 70. The start switch 70 is installed in, for example, the cabin of the vehicle 100. A start switch for vehicles is commonly called "power switch" or "ignition switch."

Figure 2:
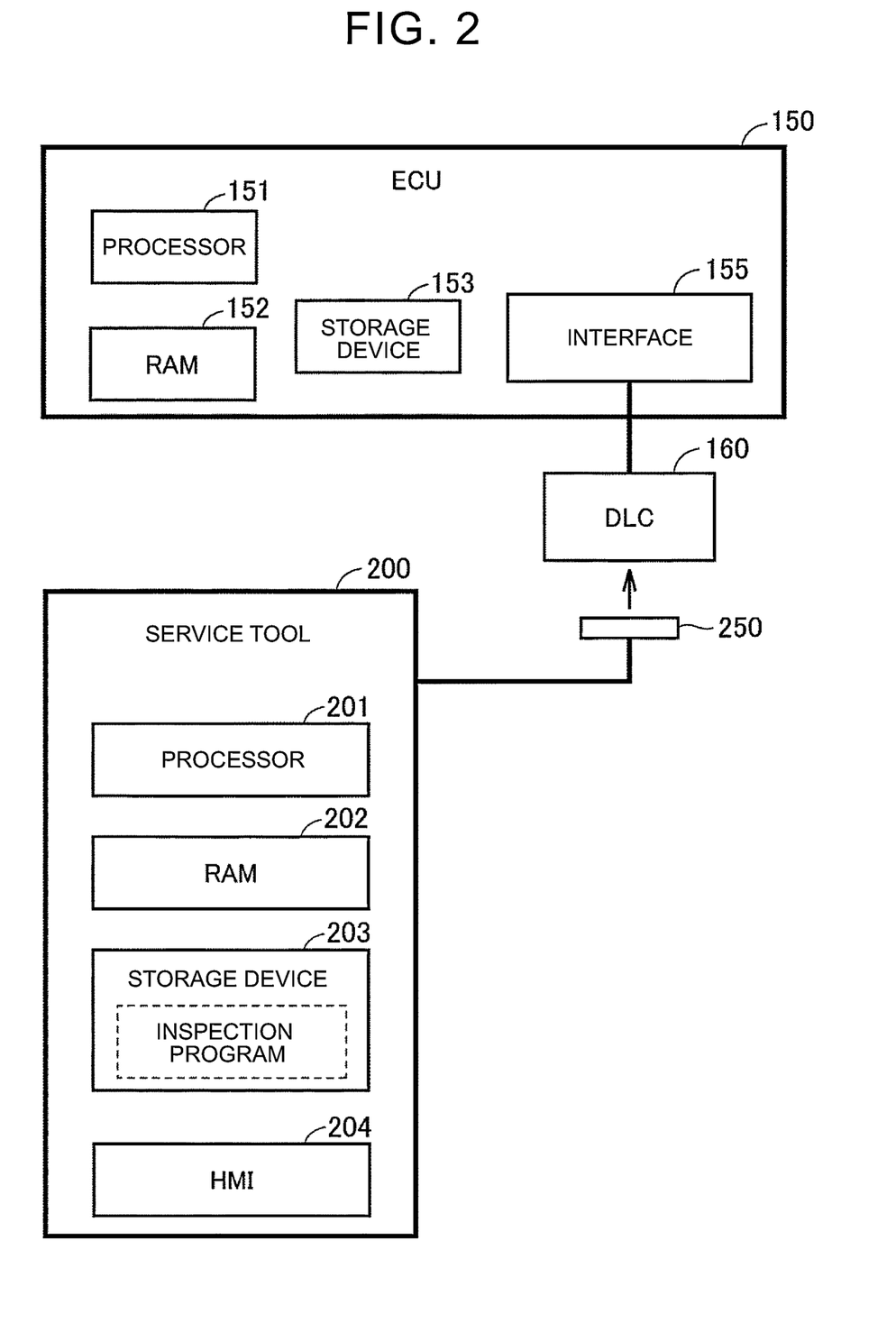
FIG. 2 shows configurations of a service tool and vehicle control device that perform a method for inspecting an energy storage device according to the embodiment of the present disclosure.

FIG. 2 shows configurations of a service tool 200 and ECU 150 that perform a method for inspecting an energy storage device according to the present embodiment. Referring to FIG. 2 along with FIG. 1, the ECU 150 includes a processor 151, a random access memory (RAM) 152, and a storage device 153. The ECU 150 may be a computer. The storage device 153 is configured to save stored information. The storage device 153 stores programs and information to be used in the programs (e.g., maps, mathematical expressions, and various parameters). In the present embodiment, various types of control in the ECU 150 (such as charge and discharge control for the battery 11) are performed by the processor 151 executing the programs stored in the storage device 153.

Although not shown in FIG. 1, the vehicle 100 further includes various sensors that detect the state of the vehicle 100 in real time (such as location sensor, outside air temperature sensor, vehicle speed sensor, and odometer). The ECU 150 sequentially records usage history data of the vehicle 100 in the storage device 153 based on the outputs of the various sensors mounted on the vehicle 100. The usage history data of the vehicle 100 may include: data indicating the period of use of the vehicle 100 (e.g., elapsed time since the start of use); data indicating the state of the vehicle 100 during the period of use (e.g., change in state or histogram of state); and data indicating the frequency of use of the vehicle 100 (e.g., odometer reading, number of trips (trip count), total charge and discharge energy, or number of charge and discharge cycles). A specific example of the usage history data will be described later (see S11 in FIG. 3).

The service tool (hereinafter simply referred to as "tool") 200 includes a computer that includes a processor 201, a RAM 202, and a storage device 203. The tool 200 further includes an HMI 204. The HMI 204 includes an input device and a display device. The HMI 204 may be a touch panel display. The HMI 204 may include a smart speaker that receives voice input.

The ECU 150 further includes an interface 155 for a data link connector (DLC) 160. The DLC 160 is connected to the interface 155 via a communication cable. The tool 200 further includes a connector 250. The connector 250 is connected to the body of the tool 200 via a communication cable. The DLC 160 is a connector that is connectable to the connector 250 of the tool 200. For example, the DLC 160 is installed near the driver's seat of the vehicle 100. By connecting the connector 250 of the tool 200 to the DLC 160, the tool 200 can read vehicle data stored in the storage device 153.

The storage device 203 of the tool 200 stores an inspection program. The method for inspecting an energy storage device according to the present embodiment (see FIG. 3 that will be described later) is performed by the processor 201 executing the inspection program stored in the storage device 203. The tool 200 is an example of the "computer device" according to the present disclosure.

In the present embodiment, an energy storage device used in a vehicle is inspected at a dealership. A dealership is a store that sells vehicles manufactured by automobile manufacturers and provides after-sales services (inspection, maintenance, etc.). For example, the user of the vehicle 100 drops off the vehicle 100 at the dealership, and an operator (e.g., a mechanic) inspects the battery 11 of the vehicle 100 with the tool 200 at the dealership. After the inspection of the battery 11 ends, the dealership returns the vehicle 100 to the user. When the battery 11 is inspected and it is determined that the battery 11 needs to be replaced, the dealership replaces the battery 11 with a new one (e.g., a brand-new battery), and returns the vehicle 100 with the replaced battery to the user. The vehicle 100 may be a vehicle owned by the user (personally owned vehicle (POV)) or a leased vehicle. The dealership may provide the after-sales services based on a subscription contract between the vehicle user and the dealership.

An example in which the battery 11 used in the vehicle 100 is inspected by the method for inspecting an energy storage device according to the present embodiment will be described below.

Figure 3:
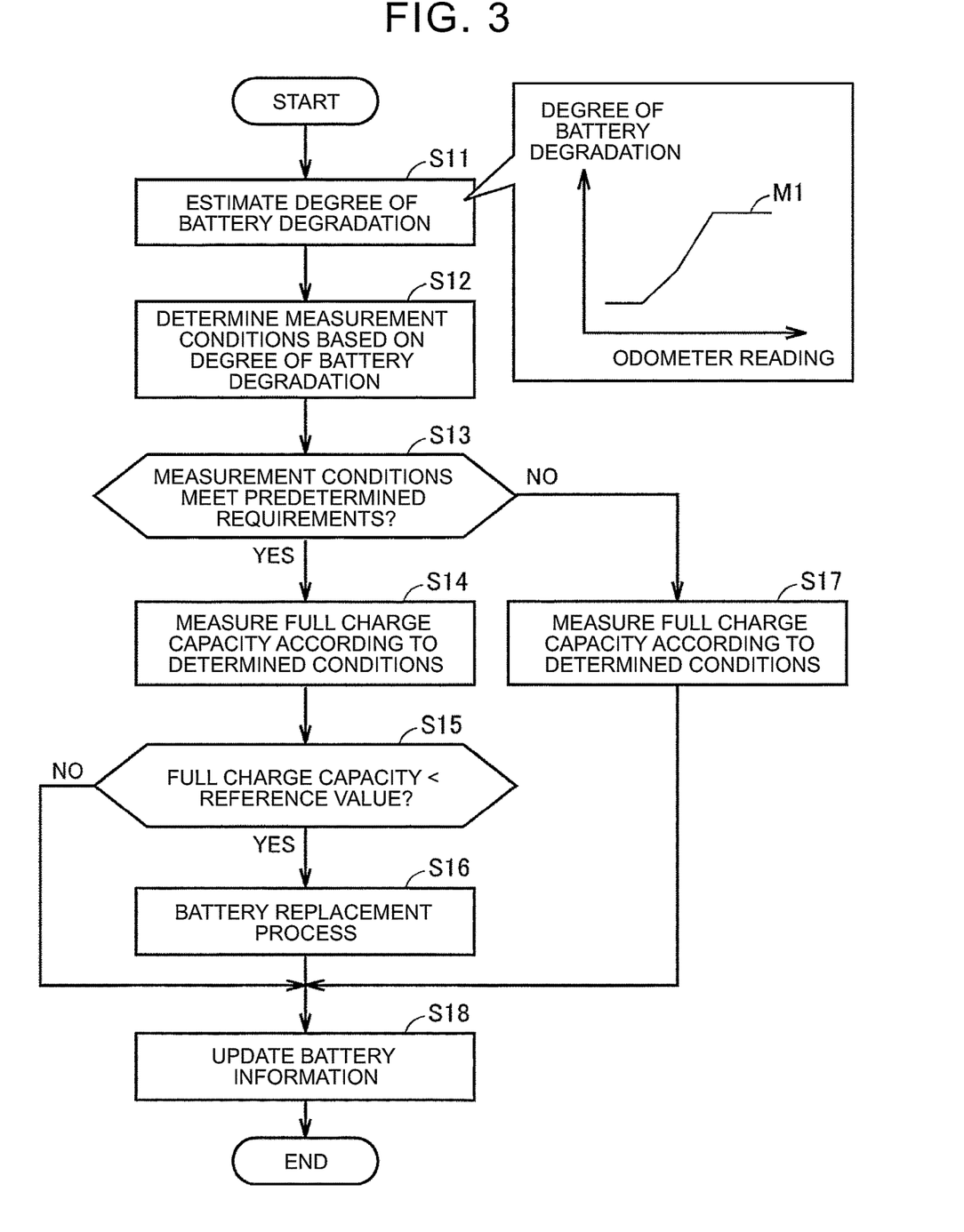
FIG. 3 is a flowchart of the method for inspecting an energy storage device according to the embodiment of the present disclosure.

FIG. 3 is a flowchart of the method for inspecting an energy storage device according to the present embodiment. The letter "S" in the flowchart means step. For example, the process shown in this flowchart is started when the operator enters an inspection start request to the tool 200 after preparations for the inspection of the battery 11 are completed. In the present embodiment, before starting the inspection, the operator electrically connects the EVSE 300 installed at the dealership to the vehicle 100 in a parked state so that the ECU 150 and the tool 200 can communicate with each other. The preparations for the inspection of the battery 11 are thus completed. The present disclosure is not limited to this, and the vehicle 100 may be electrically connected to a charger for inspection (not shown) instead of the EVSE 300. The operator may charge the battery 11 with an external power source for inspection (not shown).

Referring to FIG. 3 along with FIGS. 1 and 2, the tool 200 estimates the degree of degradation of the battery 11 in S11. Specifically, the tool 200 acquires usage history data of the vehicle 100 from the ECU 150. In the present embodiment, the odometer reading of the vehicle 100 is used as the usage history data of the vehicle 100. The tool 200 estimates the degree of degradation of the battery 11 from the odometer reading of the vehicle 100 using a map M1 corresponding to the model of the vehicle 100 (object to be inspected). The map M1 is information indicating the relationship between the odometer reading of the vehicle 100 and the degree of degradation of the battery 11. Specifically, the map M1 defines a relationship in which the degree of degradation of the battery 11 used in the vehicle 100 increases as the odometer reading of the vehicle 100 increases. That is, the tool 200 estimates that the degree of degradation of the battery 11 increases as the odometer reading of the vehicle 100 increases. The tool 200 may change the map used in S11 according to the object to be inspected.

The usage history data of the vehicle used in S11 is not limited to the odometer reading of the vehicle. For example, at least one of the following may be used instead of or in addition to the odometer reading of the vehicle: the number of years of use of the vehicle, the number of trips (trip count) of the vehicle, the total charge and discharge energy of the energy storage device, the number of charge and discharge cycles of the energy storage device, the temperature history (e.g., temperature histogram) of the energy storage device, and the SOC history (e.g., SOC histogram) of the energy storage device. The greater the number of years of use of the vehicle and the greater the number of trips of the vehicle, the higher the degree of degradation of the energy storage device used in the vehicle tends to be. The greater the total charge and discharge energy of the energy storage device and the greater the number of charge and discharge cycles of the energy storage device, the higher the degree of degradation of the energy storage device tends to be. The longer the energy storage device is left at a high temperature or at a high SOC, the higher the degree of degradation of the energy storage device tends to be.

In the subsequent step S12, the tool 200 determines conditions for measurement of the full charge capacity that will be described below (S14, S17), based on the degree of degradation of the battery 11 estimated in S11. Specifically, the tool 200 determines Chg1, Chg2, $\Delta T1$, and $\Delta T2$, which will be described below, based on the estimated degree of degradation.

Figure 4:
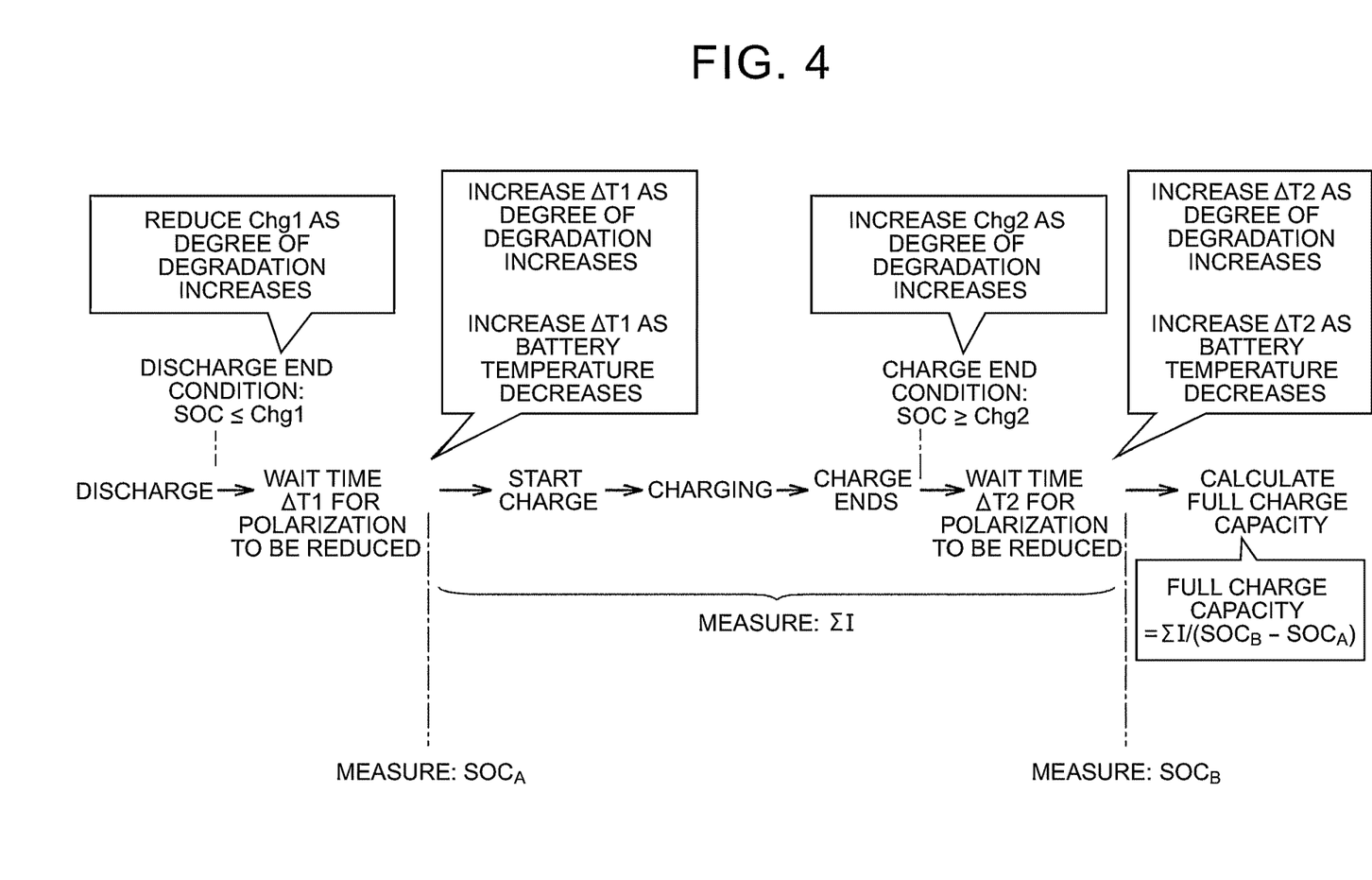
FIG. 4 illustrates a method for measuring a full charge capacity and a method for determining conditions for the measurement of the full charge capacity according to the embodiment of the present disclosure.

FIG. 4 illustrates a method for measuring the full charge capacity of the battery 11 and a method for determining the conditions for the measurement of the full charge capacity of the battery 11. Referring to FIG. 4 along with FIGS. 1 to 3, a process for measuring the full charge capacity of the battery 11 includes a discharge process, a first waiting process, a charge process, a second waiting process, and a capacity calculation process, which will be described below.

In the discharge process, the battery 11 is discharged. This discharge ends when a predetermined discharge end condition is satisfied during the discharge of the battery 11. In the present embodiment, the discharge end condition is satisfied when the SOC of the battery 11 becomes equal to or lower than a first SOC value (Chg1) during the discharge of the battery 11. In S12 of FIG. 3, the tool 200 sets Chg1 to a lower value as the degree of degradation estimated in S11 is higher.

In the first waiting process, the routine waits until a first wait time ($\Delta T1$) elapses without charging and discharging the battery 11 after the discharge process ends. Leaving the battery 11 reduces polarization caused by charge and discharge. In S12 of FIG. 3, the tool 200 sets $\Delta T1$ to a longer value as the degree of degradation estimated in S11 is higher. In S12 of FIG. 3, the tool 200 also acquires the temperature of the battery 11 from the ECU 150, and sets $\Delta T1$ to a longer value as the temperature of the battery 11 is lower.

When $\Delta T1$ has elapsed since the end of the discharge, the tool 200 acquires a voltage value (actual measured value) of the battery 11 measured in the vehicle 100, and records the acquired voltage value (V1) in the storage device 203. V1 is the voltage value of the battery 11 after the elapse of $\Delta T1$. The higher the SOC of the battery 11, the higher the voltage of the battery 11. Therefore, the measured voltage value (V1) indicates the SOC of the battery 11 at the start of charge (hereinafter referred to as "$SOC_A$"). V1 is an actual measured value of $SOC_A$.

The charge process is performed after the first waiting process ends (more specifically, after $SOC_A$ is actually measured). In the charge process, the battery 11 is charged. In the charge process, the battery 11 is charged at a predetermined charge rate (e.g., a constant rate). During the charge of the battery 11, a current value (I) of the battery 11 is measured and recorded. This charge ends when a predetermined charge end condition is satisfied during the charge of the battery 11. In the present embodiment, the charge end condition is satisfied when the SOC of the battery 11 becomes equal to or higher than a second SOC value (Chg2) during the charge of the battery 11. In S12 of FIG. 3, the tool 200 sets Chg2 to a higher value as the degree of degradation estimated in S11 is higher.

In the second waiting process, the routine waits until a second wait time ($\Delta T2$) elapses without charging and discharging the battery 11 after the charge process ends. Leaving the battery 11 reduces polarization caused by charge and discharge. In S12 of FIG. 3, the tool 200 sets $\Delta T2$ to a longer value as the degree of degradation estimated in S11 is higher. In S12 of FIG. 3, the tool 200 also acquires the temperature of the battery 11 from the ECU 150, and sets $\Delta T2$ to a longer value as the temperature of the battery 11 is lower.

When $\Delta T2$ has elapsed since the end of the charge, the tool 200 acquires a voltage value (actual measured value) of the battery 11 measured in the vehicle 100, and records the acquired voltage value (V2) in the storage device 203. V2 is the voltage value of the battery 11 after the elapse of $\Delta T2$. The measured voltage value (V2) indicates the SOC of the battery 11 at the end of the charge (hereinafter referred to as "$SOC_B$"). V2 is an actual measured value of $SOC_B$.

The capacity calculation process is performed after the second waiting process ends (more specifically, after $SOC_B$ is actually measured). In the capacity calculation process, the full charge capacity of the battery 11 is obtained using the SOC of the battery 11 at the start of the charge ($SOC_A$), the current value (I) of the battery 11 during the charge, and the SOC of the battery 11 at the end of the charge ($SOC_B$) as measured as described above. Specifically, the tool 200 calculates the full charge capacity of the battery 11 according to the expression "full charge capacity=$\Sigma I/\Delta SOC$" shown in FIG. 4. $\Sigma I$ means an integrated current value of the battery 11 during the charge. $\Delta SOC$ means the SOC range from $SOC_A$ to $SOC_B$. $\Delta SOC$ is $SOC_B$ minus $SOC_A$ ($SOC_B - SOC_A$). The full charge capacity of the battery 11 is the amount of energy stored in the battery 11 when fully charged.

Referring back to FIG. 3, in S12, the tool 200 determines Chg1, Chg2, $\Delta T1$, and $\Delta T2$ in the manner described above. Specifically, the tool 200 determines Chg1, Chg2, $\Delta T1$, and $\Delta T2$ so that the time it takes to measure the full charge capacity increases as the degree of degradation estimated in S11 increases. For example, the tool 200 sets each of $\Delta T1$ and $\Delta T2$ to a longer value as the estimated degree of degradation is higher. Therefore, the higher the estimated degree of degradation, the more likely polarization of the battery 11 is to be reduced, and the higher the measurement accuracy of the full charge capacity becomes. However, the longer the wait times $\Delta T1$, $\Delta T2$, the longer it takes to measure the full charge capacity. The tool 200 sets Chg1 to a lower value as the estimated degree of degradation is higher and Chg2 to a higher value as the estimated degree of degradation is higher. Therefore, the higher the estimated degree of degradation, the larger the $\Delta SOC$, and the higher the measurement accuracy of the full charge capacity becomes. However, the larger the $\Delta SOC$, the longer it takes to measure the full charge capacity. The method for determining the measurement conditions is not limited to that described above. For example, the measurement conditions may be determined so that the measurement accuracy is high (measurement time is long) when the degree of degradation of the energy storage device is within a predetermined range (around the degree of degradation for which it is desired to accurately measure the full charge capacity).

In the subsequent step S13, the tool 200 determines whether the measurement conditions determined in S12 meet predetermined requirements (hereinafter also referred to as "inspection requirements"). The inspection requirements according to the present embodiment are met when all of the following items (A) to (D) are satisfied, and are not met when any of the items (A) to (D) is not satisfied.

(A) Chg1 is equal to or less than Th1.
(B) Chg2 is equal to or greater than Th2.
(C) $\Delta T1$ is equal to or greater than Th3.
(D) $\Delta T2$ is equal to or greater than Th4.

As described above, the inspection requirements according to the present embodiment are defined by Th1 to Th4. Th1 to Th4 can be set as desired. For example, Th1 to Th4 may be values determined by laws and regulations such as the "Automobile Three Guarantees Regulations" that specify responsibilities for repair, replacement, and return of automobiles. The inspection requirements are not limited to the above example, and can be set as desired.

When the measurement conditions determined in S12 meet the inspection requirements (YES in S13), the tool 200 measures in S14 the full charge capacity of the battery 11 according to the measurement conditions determined in S12. In the present embodiment, when the degree of degradation estimated in S11 is higher than a predetermined value, the tool 200 determines in S12 the measurement conditions so that the measurement conditions meet the inspection requirements (S13). Therefore, when the degree of degradation estimated in S11 is higher than the predetermined value, the tool 200 measures in S14 the full charge capacity of the battery 11 according to the measurement conditions that meet the inspection requirements. It therefore becomes easier to accurately measure the full charge capacity of the degraded battery 11.

In S14, the tool 200 performs the discharge process, the first waiting process, the V1 ($SOC_A$) measurement process, the charge process, the second waiting process, the V2 ($SOC_B$) measurement process, and the capacity calculation process in this order (see FIG. 4).

In the discharge process, the tool 200 sends a discharge command to the ECU 150 so that discharge of the battery 11 is performed according to the measurement conditions, and the ECU 150 controls the charger and discharger 61 in response to the discharge command from the tool 200. The power output from the battery 11 during the discharge of the battery 11 is output to outside the vehicle through, for example, the inlet 60. However, the present disclosure is not limited to this, and the power output from the battery 11 in the discharge process may be used to charge an auxiliary battery, not shown, or may be consumed by in-vehicle devices (lighting devices, air conditioner, heater, etc.).

In the charge process, the tool 200 sends a charge command to the ECU 150 so that charge of the battery 11 is performed according to the measurement conditions, and the ECU 150 controls the charger and discharger 61 in response to the charge command from the tool 200. The battery 11 is thus charged with the power supplied from, for example, the EVSE 300 (power supply equipment outside the vehicle). During the charge of the battery 11, the tool 200 sequentially acquires from the ECU 150 the current value (I) of the battery 11 measured by the BMS 11a. Alternatively, the tool 200 acquires the integrated value ($\Sigma I$) of the charging current from the ECU 150 after the charge ends.

In each of the first and second waiting processes, the tool 200 sends a wait command to the ECU 150. In each of the V1 and V2 measurement processes, the tool 200 acquires from the ECU 150 the voltage value (V1, V2) of the battery 11 measured by the BMS 11a or the SOC value ($SOC_A$, $SOC_B$) converted from the measured voltage value. In the capacity calculation process, the tool 200 calculates the full charge capacity of the battery 11 according to the expression "full charge capacity=$\Sigma I/\Delta SOC$" shown in FIG. 4.

After the full charge capacity of the battery 11 is measured in S14, the process proceeds to S15. In S15, the tool 200 determines based on the full charge capacity measured in S14 whether the battery 11 needs to be replaced. Specifically, the tool 200 determines whether the full charge capacity measured in S14 is smaller than a predetermined reference value. The reference value can be set as desired. The reference value may be set based on the initial full charge capacity of the battery 11. When the full charge capacity measured in S14 is smaller than the reference value, it is determined that the battery 11 needs to be replaced (YES in S15), and the battery 11 is replaced in S16. The process then proceeds to S18. On the other hand, when the full charge capacity measured in S14 is equal to or larger than the reference value, it is determined that the battery 11 does not need to be replaced (NO in S15), and the process proceeds to S18 without performing replacement of the battery 11 (S16).

In S16, the tool 200 performs a battery replacement process. For example, the tool 200 instructs the ECU 150 to get the battery 11 ready for removal. The ECU 150 disconnects the battery 11 from a circuit according to the instruction from the tool 200, and sends to the tool 200 a reply telling that the preparations for battery replacement are completed. In response to the reply from the ECU 150, the tool 200 sends a notification prompting the operator to replace the battery 11. For example, the tool 200 causes the HMI 204 to display a message prompting to replace the battery 11. The operator then removes the battery 11 from the vehicle 100 and installs a new battery in the vehicle 100. Thereafter, the ECU 150 connects the new battery installed in the vehicle 100 to the circuit and performs a predetermined initialization process. The battery replacement in the vehicle 100 is thus completed.

In S18, the tool 200 writes the information on the battery of the vehicle 100 acquired in the series of steps shown in FIG. 3 to the storage device 153 of the ECU 150. For example, when NO in S15, the full charge capacity of the battery 11 acquired in S14 is recorded in the storage device 153. When YES in S15, the specifications (including the full charge capacity) of the battery newly installed in the vehicle 100 are recorded in the storage device 153 together with the battery replacement date and time. The battery information recorded in the storage device 153 may be used for maintenance or assessment (evaluation) of the vehicle 100.

Even when the measurement conditions determined in S12 do not meet the inspection requirements (NO in S13), the tool 200 still measures in S17 the full charge capacity of the battery 11 according to the measurement conditions determined in S12. The measurement in S17 is performed by a procedure similar to that of the measurement in S14, but the measurement conditions (Chg1, Chg2, ΔT1, and ΔT2) are different between S14 and S17. The measurement accuracy in S14 is higher than that in S17. However, the measurement time (time required for the measurement) in S17 is shorter than that in S14. In the present embodiment, NO in S13 means that the degree of degradation of the battery 11 is sufficiently low.

After the full charge capacity of the battery 11 is measured in S17, the process proceeds to S18. In S18, the full charge capacity of the battery 11 acquired in S17 is recorded in the storage device 153 of the ECU 150. The series of steps shown in FIG. 3 ends after S18 is performed.

As described above, the method for inspecting an energy storage device according to the present embodiment includes: estimating the degree of degradation of the energy storage device (battery 11) (S11); determining the measurement conditions based on the estimated degree of degradation (S12); and measuring the full charge capacity of the energy storage device according to the determined measurement conditions (S14). Determining the measurement conditions (S12) includes determining the measurement conditions so that the time it takes to measure the full charge capacity increases as the estimated degree of degradation increases (see FIG. 4).

According to the above method, the measurement conditions are determined so that the time it takes to measure the full charge capacity increases as the estimated degree of degradation of the energy storage device increases. Therefore, when the degree of degradation of the energy storage device is sufficiently low, the full charge capacity is measured in a short time. When the degree of degradation of the energy storage device is high, the measurement time is increased so that the full charge capacity can be accurately measured. As described above, according to the above method, it is possible to adjust the time it takes to inspect the energy storage device according to the state of the energy storage device.

Figure 5:
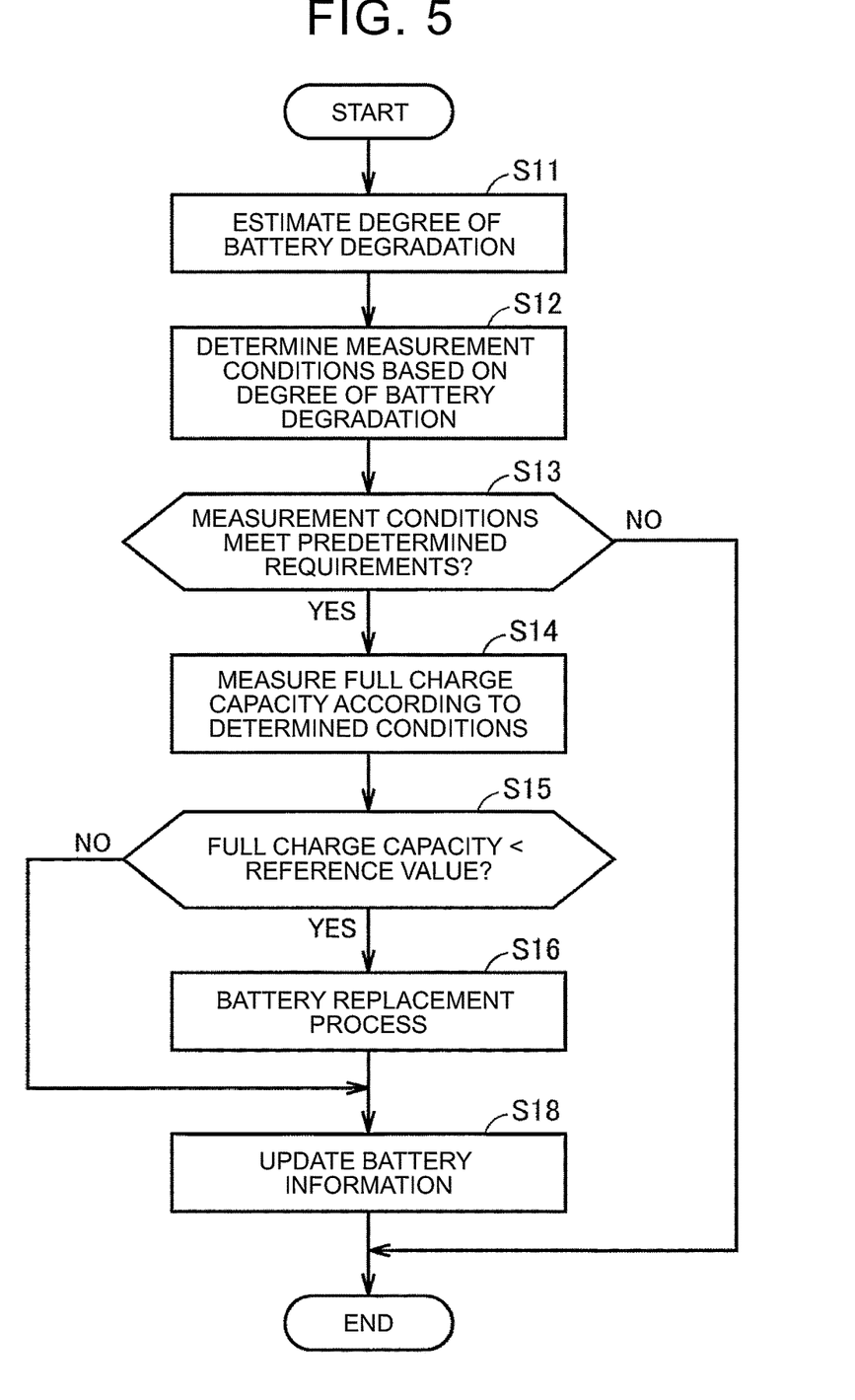
FIG. 5 is a flowchart of a modification of the process shown in FIG. 3.

FIG. 5 is a flowchart illustrating a modification of the process shown in FIG. 3. A series of steps shown in FIG. 5 is the same as that shown in FIG. 3 except that S17 (FIG. 3) is omitted.

Referring to FIG. 5, in this modification as well, when the degree of degradation estimated in S11 is higher than the predetermined value, the tool 200 determines in S12 the measurement conditions that meet the inspection requirements. Therefore, the determination result of S13 is YES, and in the subsequent step S14, the full charge capacity of the battery 11 is measured according to the measurement conditions determined in S12. On the other hand, when the degree of degradation estimated in S11 is not higher than the predetermined value, the tool 200 determines in S12 the measurement conditions that do not meet the inspection requirements. Therefore, the determination result of S13 is NO. In this case, the series of steps shown in FIG. 5 ends without performing the measurement of the full charge capacity according to the measurement conditions determined in S12. In this modification as well, NO in S13 means that the degree of degradation of the battery 11 is sufficiently low.

According to the method of the modification, when the estimated degree of degradation is higher than the predetermined value, the full charge capacity is measured according to the measurement conditions that meet the inspection requirements (S14). The full charge capacity can thus be accurately measured. When the estimated degree of degradation is not higher than the predetermined value, the estimation of the degree of degradation of the energy storage device (S11) is performed, but the measurement of the full charge capacity according to the measurement conditions is not performed. This reduces the time it takes to inspect the energy storage device, so that user convenience is less likely to be reduced by the inspection.

The method for estimating the degree of degradation of the battery 11 in S11 of FIG. 3 or FIG. 5 can be changed as appropriate. For example, the tool 200 may estimate the degree of degradation of the battery 11 according to the expression "full charge capacity=ΣI/ΔSOC" shown in FIG. 4, based on changes in state of the battery 11 (e.g., changes in current and voltage) measured while the vehicle 100 is in use. The tool 200 may also estimate the degree of degradation of the energy storage device according to the Arrhenius law, based on either or both of the temperature histogram and SOC histogram of the energy storage device measured while the vehicle 100 is in use. The BMS 11a may have a state of health (SOH) estimation function. The tool 200 may acquire the SOH of the battery 11 estimated by the BMS 11a from the vehicle 100 in S11 of FIG. 3 or 5. The SOH is, for example, the ratio of the current full charge capacity to the initial full charge capacity, and varies between 0% and 100%. The higher the degree of degradation of the energy storage device, the lower the SOH of the energy storage device.

The method for determining the measurement conditions in S12 of FIG. 3 or 5 is not limited to the mode shown in FIG. 4. For example, it is not always necessary to change ΔT1 and ΔT2 according to the measured temperature of the battery 11. It is also not always necessary to change all of Chg1, Chg2, ΔT1, and ΔT2 according to the estimated degree of degradation of the battery 11. For example, only three, two, or one of Chg1, Chg2, ΔT1, and ΔT2 may be selected and changed according to the estimated degree of degradation of the battery 11.

In the above embodiment, the charge rate is not included in the measurement conditions determined in S12 of FIG. 3.

However, the present disclosure is not limited to this, and the charge rate for the measurement of the full charge capacity may be variable according to the degree of degradation of the battery 11. For example, the charge rate for the charge process may be set so that the charge rate decreases as the degree of degradation of the battery 11 estimated in S11 of FIG. 3 or 5 increases.

In the method for inspecting an energy storage device according to the above embodiment, the battery 11 is inspected without removing it from the vehicle 100. However, the present disclosure is not limited to this. The energy storage device may be removed from the vehicle, and the removed energy storage device may be inspected and placed back into the vehicle after the inspection is finished.

The configuration of the vehicle is not limited to that described above (see FIG. 1). The vehicle may include a charger (charge circuit) instead of the charger and discharger. The above method for inspecting an energy storage device may be applied to electrified vehicles (xEVs) other than BEVs (such as plug-in hybrid electric vehicles (PHEVs), fuel cell electric vehicles (FCEVs), and range-extended electric vehicles (REEVs)). The above method for inspecting an energy storage device may be applied to stationary energy storage systems for use in buildings (houses, factories, etc.).

The embodiment disclosed herein shall be construed as illustrative in all respect and not restrictive. The scope of the present disclosure is shown by the claims rather than by the above description of the embodiment, and is intended to include all modifications within the meaning and scope equivalent to those of the claims.

What is claimed is:

1. A method for inspecting an energy storage device, the method comprising:
    estimating a degree of degradation of the energy storage device;
    determining, based on the estimated degree of degradation, a measurement condition such that time required to measure a full charge capacity of the energy storage device decreases or increases;
    measuring the full charge capacity according to the determined measurement condition;
    determining whether the determined measurement condition meets a predetermined requirement; and
    when determination is made that the measurement condition meets the predetermined requirement,
        performing the measurement of the full charge capacity, and
        determining, based on the measured full charge capacity, whether the energy storage device needs to be replaced, wherein
    determining, according to the estimated degree of degradation, the measurement condition includes determining the measurement condition such that the measurement condition meets the predetermined requirement.

2. The method according to claim 1, wherein determining the measurement condition includes determining the measurement condition such that the time required to measure the full charge capacity decreases.

3. The method according to claim 1, further comprising determining whether the determined measurement condition meets a predetermined requirement, wherein:
    determining, according to the estimated degree of degradation, the measurement condition includes determining the measurement condition such that the measurement condition meets the predetermined requirement; and
    the measurement of the full charge capacity is performed when determination is made that the measurement condition meets the predetermined requirement, but is not performed when determination is made that the measurement condition does not meet the predetermined requirement.

4. The method according to claim 1, wherein:
    measuring the full charge capacity of the energy storage device includes
        discharging the energy storage device,
        waiting until first wait time elapses without charging and discharging the energy storage device after the discharge ends,
        charging the energy storage device after elapse of the first wait time,
        waiting until second wait time elapses without charging and discharging the energy storage device after the charge ends, and
        obtaining the full charge capacity of the energy storage device after elapse of the second wait time; and
    determining the measurement condition includes determining at least one of the following based on the estimated degree of degradation: a condition for ending the discharge, the first wait time, a condition for ending the charge, and the second wait time.

5. The method according to claim 4, wherein:
    discharging the energy storage device includes ending the discharge when a state of charge of the energy storage device becomes equal to or less than a first state-of-charge value during the discharge of the energy storage device;
    charging the energy storage device includes ending the charge when the state of charge of the energy storage device becomes equal to or higher than a second state-of-charge value during the charge of the energy storage device; and
    obtaining the full charge capacity of the energy storage device includes calculating the full charge capacity of the energy storage device using a voltage value of the energy storage device after the elapse of the first wait time and a voltage value of the energy storage device after the elapse of the second wait time.

6. The method according to claim 5, wherein
    the first state-of-charge value is set to a lower value as the estimated degree of degradation is higher, and
    the second state-of-charge value is set to a higher value as the estimated degree of degradation is higher.

7. The method according to claim 4, wherein
    the first wait time is set to a longer time as the estimated degree of degradation is higher, and
    the second wait time is set to a longer time as the estimated degree of degradation is higher.

8. The method according to claim 7, wherein
    the first wait time is set to a longer time as a temperature of the energy storage device is lower, and
    the second wait time is set to a longer time as the temperature of the energy storage device is lower.

9. The method according to claim 1, wherein estimating the degree of degradation of the energy storage device includes estimating the degree of degradation of the energy storage device using a map that defines a relationship between usage history data of a vehicle and the degree of degradation.

10. A non-transitory storage medium storing instructions that are executable by one or more processors and that cause the one or more processors to perform functions, the functions comprising performing the method according to claim 1.

11. A computer device comprising the non-transitory storage medium according to claim 10.

\* \* \* \* \*